(12) United States Patent
Mossman et al.

(10) Patent No.: US 9,714,971 B1
(45) Date of Patent: Jul. 25, 2017

(54) METHOD FOR DETECTING A FAULT CONDITION OF AN OPERATIONAL AMPLIFIER

(71) Applicant: Maxim Integrated Products, Inc., San Jose, CA (US)

(72) Inventors: John A. Mossman, La Mesa, CA (US); Robert A. McCarthy, Algonquin, IL (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/929,061

(22) Filed: Oct. 30, 2015

Related U.S. Application Data

(63) Continuation of application No. 13/597,163, filed on Aug. 28, 2012, now Pat. No. 9,194,884.

(51) Int. Cl.
| | |
|---|---|
| *G01R 31/02* | (2006.01) |
| *H03F 1/52* | (2006.01) |
| *H03F 3/45* | (2006.01) |
| *H02J 1/00* | (2006.01) |
| *H01H 1/00* | (2006.01) |
| *H01L 21/00* | (2006.01) |

(52) U.S. Cl.
CPC ............. *G01R 31/02* (2013.01); *H03F 1/52* (2013.01); *H03F 3/45076* (2013.01); *H01H 1/00* (2013.01); *H01L 21/00* (2013.01); *H02J 1/00* (2013.01)

(58) Field of Classification Search
CPC ....... H01L 21/00; H01L 2221/00; G01R 1/00; H02J 1/00; G05G 1/00; G05G 2505/00; H01H 1/00; H01H 45/00; H01H 63/00; H03F 1/00
See application file for complete search history.

(56) References Cited

U.S. PATENT DOCUMENTS

| | | | | | |
|---|---|---|---|---|---|
| 4,220,833 | A | * | 9/1980 | Wert | H04B 17/407 370/243 |
| 5,781,024 | A | * | 7/1998 | Blomberg | A61B 5/00 204/406 |
| 6,433,527 | B1 | * | 8/2002 | Izadinia | H02M 3/1584 323/300 |
| 9,194,884 | B1 | * | 11/2015 | Mossman | G01R 1/00 |
| 2002/0085327 | A1 | * | 7/2002 | Kim | H02H 3/04 361/42 |
| 2009/0102488 | A1 | * | 4/2009 | Morini | G01R 31/025 324/509 |

* cited by examiner

*Primary Examiner* — Jermele M Hollington
*Assistant Examiner* — Temilade Rhodes-Vivour
(74) *Attorney, Agent, or Firm* — TIPS Group

(57) ABSTRACT

A method for detecting a fault condition of an operational amplifier of an integrated circuit during operation includes operating an integrated circuit which includes an operational amplifier (op-amp) having a V+ input, a V− input and an op-amp output and an on-line fault detector electrically coupled to the V+ input and the V− input of the op-amp of the on-line fault detector, monitoring an operation of the op-amp with the on-line fault detector, and developing a fault signal at a fault detector output if the op-amp is in a fault condition as determined by the on-line fault detector.

9 Claims, 4 Drawing Sheets

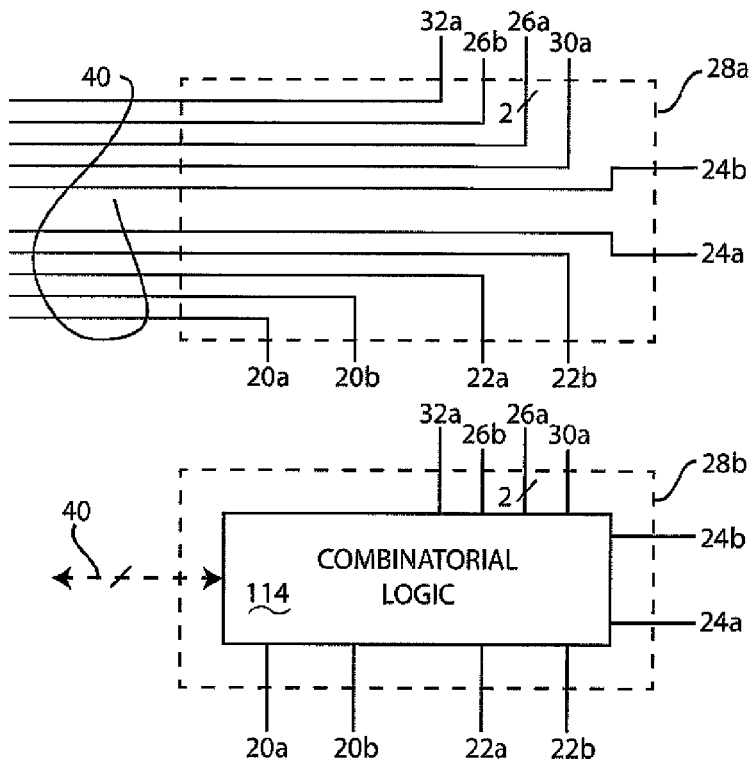
FIG. 6A
FIG. 6B
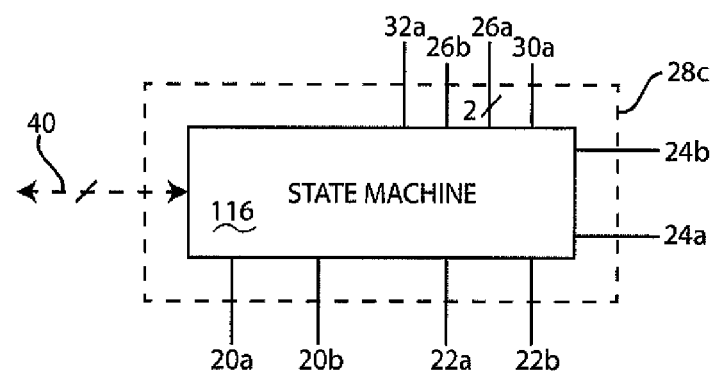
FIG. 6C
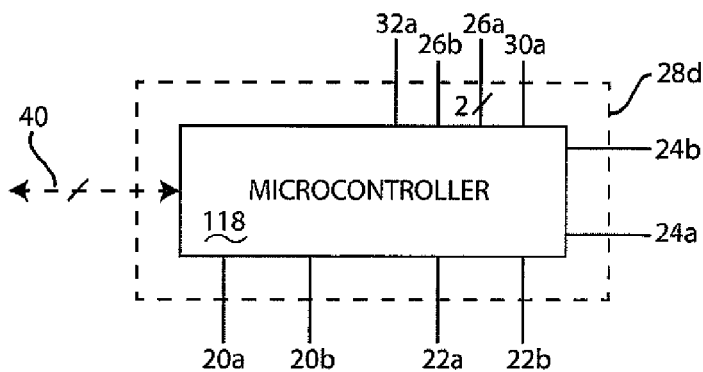
FIG. 6D

METHOD FOR DETECTING A FAULT CONDITION OF AN OPERATIONAL AMPLIFIER

CROSS REFERENCE TO RELATED APPLICATION(S)

This application is a continuation of U.S. Ser. No. 13/597,163, filed Aug. 28, 2012, which is incorporated herein by reference.

BACKGROUND

Integrated circuits (ICs) can be digital, analog or mixed. Typically, the design and manufacture of digital ICs is different from the design and manufacture of analog ICs. Therefore, mixed ICs generally require additional production effort and costs.

An example of an analog device that can be provided on an IC is the operational amplifier ("op-amp"). An op-amp is a DC-coupled, high gain electronic voltage amplifier with differential inputs including a V+ input and a V− input. The output voltage of the op-amp is given by the equation $V_{out}=A_{OL}(V_+-V_-)$, where $V_+$ is the voltage at the non-inverting terminal, $V_-$ is the voltage at the inverting terminal and $A_{OL}$ is the open-loop gain of the amplifier.

Since the magnitude of $A_{OL}$ is typically very large (e.g. 100,000 or more) and therefore even a quite small difference between V+ and V− ("the differential voltage") drives the amplifier output nearly to the supply voltage. Situations in which the output voltage is equal or greater than the supply voltage are referred to as saturation of the amplifier and can be dangerous to both the op-amp and the system to which it forms a part. If predictable operation is desired, negative feedback is used, by applying a portion of the output voltage to the inverting input. The closed loop feedback greatly reduces the gain of the amplifier.

Digital integrated circuits can be tested with a technique known as built-in self-test (BIST). BIST techniques have been used for on-line testing (during the normal operation of the IC) and off-line testing (during a test mode operation of the IC). Structures used for on-line and off-line BIST are different. This is because on-line BIST uses normally occurring data as inputs and employs redundancy techniques such as information redundancy, time redundancy, and hardware redundancy to do on-line checking. Off-line BIST, on the other hand, uses stored and/or generated test vectors as inputs and employs compression and comparison techniques.

Analog integrated circuits, such as those incorporating op-amp devices, can be critical components in many electronic systems. Furthermore, some analog ICs, particularly those used in industrial applications, can be relatively high power devices. In those situations where analog devices are not operating within proper parameters it is possible for those devices to become damaged and/or cause damage to other components. In general, analog ICs do not have comparable techniques to either the off-line or the on-line BIST testing of digital ICs.

These and other limitations of the prior art will become apparent to those of skill in the art upon a reading of the following descriptions and a study of the several figures of the drawing.

SUMMARY

In an embodiment, set forth by way of example and not limitation, an integrated circuit with analog device fault detection includes an integrated circuit die having an analog device, an on-line fault detector and a control circuit. The integrated circuit die is enclosed within an electrically insulating package and a number of pins extend through the electrically insulating package and connect to the integrated circuit die.

In this example, the analog device has a power input, an analog device input and an analog device output and the on-line fault detector is coupled to at least one of the power input, the analog device input and the analog device output and has a fault detector output. The control circuit is, in this example, coupled to the fault detector and is responsive to the fault detector output.

In certain example embodiments, the integrated circuit with analog device fault detection further includes detector self-test (DST) circuitry to test the on-line fault detector. In other example embodiments the integrated circuit die further comprises a first circuit breaker that couples a power supply to the power input of the analog device. In other example embodiments, the integrated circuit die further includes a second circuit breaker coupled to the analog device output.

The control logic can be implemented in a number of manners. For example, the control logic can include electrically conductive lines coupled to pins of the integrated circuit for off-chip control. Alternatively, the control logic can include various forms of on-chip logic such as combinatorial logic, state machines and microcontrollers.

In an embodiment, set forth by way of example and not limitation, a method for detecting a fault condition of an analog device of an integrated circuit during operation includes: (a) operating an integrated circuit which includes both an analog device and an on-line fault detector electrically coupled to the analog device; (b) monitoring an operation of the analog device with the on-line fault detector; and (c) developing a fault signal if the analog device is in a fault condition as determined by the on-line fault detector.

In an embodiment, set forth by way of example and not limitation, a method for detecting a fault condition of an operational amplifier of an integrated circuit during operation includes: operating an integrated circuit which includes an operational amplifier (op-amp) having a V+ input, a V− input and an op-amp output and an on-line fault detector electrically coupled to the V+ input and the V− input of the op-amp of the on-line fault detector; monitoring an operation of the op-amp with the on-line fault detector; and developing a fault signal at a fault detector output if the op-amp is in a fault condition as determined by the on-line fault detector.

An advantage of example embodiments is that an analog device on an integrated circuit can be monitored for proper performance while it is being used (i.e. on-line). An advantage of other example embodiments is that the system of which the integrated circuit is a part can be alerted if when fault in the operation of the analog device is detected. An advantage of other example embodiments is that, upon detection of a fault with the analog device, the integrated circuit can protect the remainder of the IC and the system of which it form a part by tripping one or more circuit breakers.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 6A is a schematic diagram of a first example control circuit of FIG. 1;

FIG. 6B is a schematic diagram of a second example control circuit of FIG. 1;

FIG. 6C is a schematic diagram of a third example control circuit of FIG. 1; and FIG. 6D is a schematic diagram of a fourth example control circuit of FIG. 1.

DETAILED DESCRIPTION OF EXAMPLE EMBODIMENTS

Figure 1:
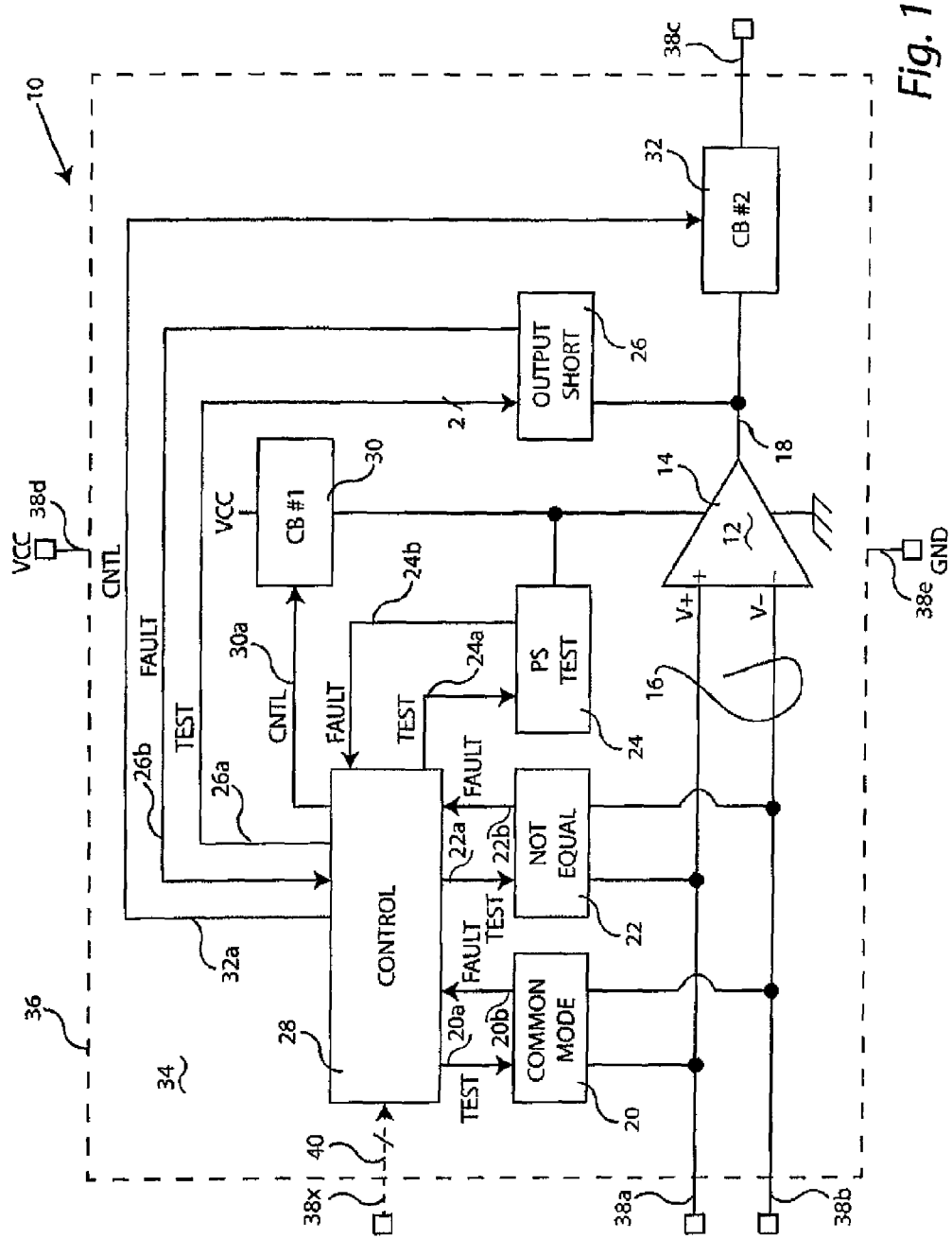
FIG. 1 is a block diagram of an example integrated circuit with analog device fault detection.

FIG. 1 is a block diagram, set forth by way of example and not limitation, of an integrated circuit 10 including an analog device such as an operational amplifier ("op-amp") 12 having a power input 14, an analog device input 16, and an analog device output 18. The example integrated circuit 10 further includes at least one on-line fault detector (e.g. COMMON MODE fault detector 20, NOT EQUAL fault detector 22, POWER SUPPLY ("PS TEST") fault detector 24, and OUTPUT SHORT fault detector 26), a control circuit 28, a first circuit breaker ("CB #1") 30 and a second circuit breaker ("CB #2") 32. As will be appreciated by those of skill in the art, more or fewer on-line fault detectors and/or circuit breakers can be provided by integrated circuit 10, as well as other analog and/or digital circuitry.

Integrated circuit 10 includes a semiconductor die 34 which is diced from a semiconductor wafer comprising silicon, gallium arsenide, or other semiconductor material. The semiconductor die is enclosed within an insulating package 36 comprising a plastic, ceramic or other insulating material. The integrated circuit 10 further includes a number of conductive pins 38 (e.g. pins 38a, 38b, 38c, 38d and 38e) comprising metal or a metal alloy which extend through the insulating package 36 and connect to the die 34. In this non-limiting example, pins 38a and 38b connect to analog device input 16, pin 38c connects to circuit breaker 32, pin 38d connects to a positive power supply voltage Vcc rail of the die 34, and pin 38e connects to a ground rail of the die 34.

While the current example refers to a single semiconductor die, it is to be understood that in certain embodiments more than one semiconductor die can be provided within a semiconductor package of an integrated circuit. As used herein, a "die" will mean either a single die or multiple dies connected together within a single semiconductor package.

In this non-limiting example, the analog device is an operational amplifier ("op-amp") 12 and at least one of the on-line fault detectors (e.g. NOT EQUAL fault detector 22) is particularly adapted for use with op-amp 12. However, it will be appreciated by those of skill in the art that analog devices other than op-amp 12 can alternatively be provided on an integrated circuit and monitored by appropriate on-line fault detectors. Op-amp 12 includes a V+ input and a V− input which are connected to pins 38a and 38b, respectively, by a differential pair of lines comprising analog input 16.

In this example, the COMMON MODE fault detector 20 and NOT EQUAL fault detector 22 are coupled to analog input 16 and, therefore, to the V+ and V− inputs of op-amp 12. PS TEST fault detector 24 is coupled to power input 14 and OUTPUT SHORT fault detector 26 is coupled to analog device output 18. Furthermore, in this example, each of fault detectors 20, 22, 24 and 26 are coupled to the control circuit 28 by TEST lines 20a, 22a, 24a and 26a, respectively, and FAULT lines 20b, 22b, 24b and 26b, respectively. First circuit breaker 30 is coupled between Vcc and power input 14 and second circuit breaker 32 is coupled between analog device output 18 and pin 38c. The circuit breakers 30 and 32 are coupled to control circuit 28 by CNTL lines 30a and 32a, respectively. Control circuit 28 is optionally coupled to one or more pins 38x by a bus 40 comprising one or more conductive lines. In certain embodiments a bus 40 and pins 38x are not provided.

Figure 2:
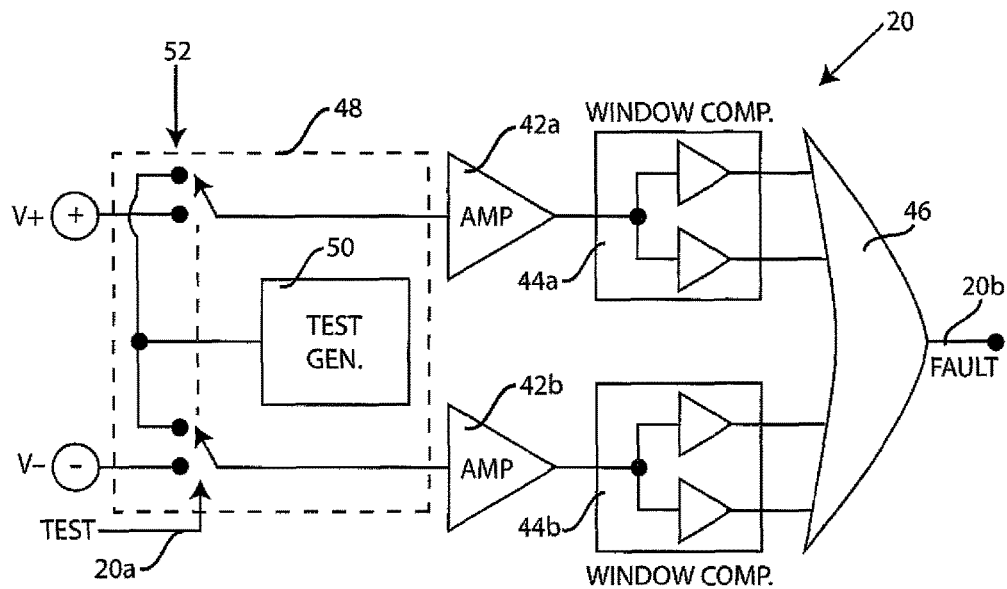
FIG. 2 is a block diagram of an example COMMON MODE fault detector of FIG. 1.

FIG. 2 is a block diagram, set forth by way of example and not limitation, of a COMMON MODE fault detector 20 including amplifiers 42a and 42b, window comparators 44a and 44b, and an OR gate 46. In this example, the COMMON MODE fault detector 20 also includes detector self-test (DST) circuitry 48 including a test generator 50 and a double-pole double-throw (DPDT) electronic switch 52. COMMON MODE fault detector 20 is designed to detect common-mode interference and noise at the two inputs of op-amp 12 by detecting if either of the inputs is outside of its acceptable "window" of voltage levels.

In a normal operational mode, switch 52 couples the V+ input of op-amp 12 to the input of amplifier 42a and the V− input of op-amp 12 to the input of amplifier 42b. Outputs of amplifiers 42a and 42b are coupled to inputs of window comparators 44a and 44b, respectively. The outputs of window comparators 44a and 44b are input into OR gate 46 to produce a signal on FAULT line 20b.

At certain times it is desirable for the control circuitry 28 to activate the DST circuitry 48 by applying a test control signal to TEST line 20a. For example, a test control signal may be applied upon power-up of the integrated circuit 10. A test control signal can also be applied periodically or sporadically during the operation of integrated circuit 10 or during times when the integrated circuit 10 detects an idle condition. When a test control signal is applied to the TEST line 20a by control circuitry 28, the switch 20a is activated and an output of test generator is applied to the inputs of amplifiers 42a and 42. During the DST process, the COMMON MODE fault detector 20 is uncoupled from the V+ and V− inputs of op-amp 12, which can continue to operate as normal. It will therefore be appreciated that switch 52 selectively couples the window comparators 44a and 44b to either the V+ and V− inputs of the op-amp 12 or to the test generator 50, in this non-limiting example.

The test generator 50 generates one or more voltage levels to determine if the COMMON MODE fault detector 20 is working properly (e.g. if the upper and lower thresholds of the window comparators are within tolerance levels). Since the control circuitry 28 generated the test control signal that is applied to the line 20a, it knows that the signal on fault line 20b is in response to the test voltages produced by test generator 50 and not due to its monitoring of op-amp 12. Also, additional communication lines can be provided between the COMMON MODE fault detector 20 and the control circuitry 28 for more communication or control.

If the control circuitry 28 determines that the COMMON MODE fault detector 20 is not working properly, it can leave it disconnected from the op-amp 12 and/or can provide a signal on bus 40 to alert the system that the COMMON MODE fault detector is not working properly. After the self-test, the test control signal can be removed from the TEST line 20a and the COMMON MODE fault detector can return to its normal on-line monitoring of the operation of op-amp 12.

Figure 3:
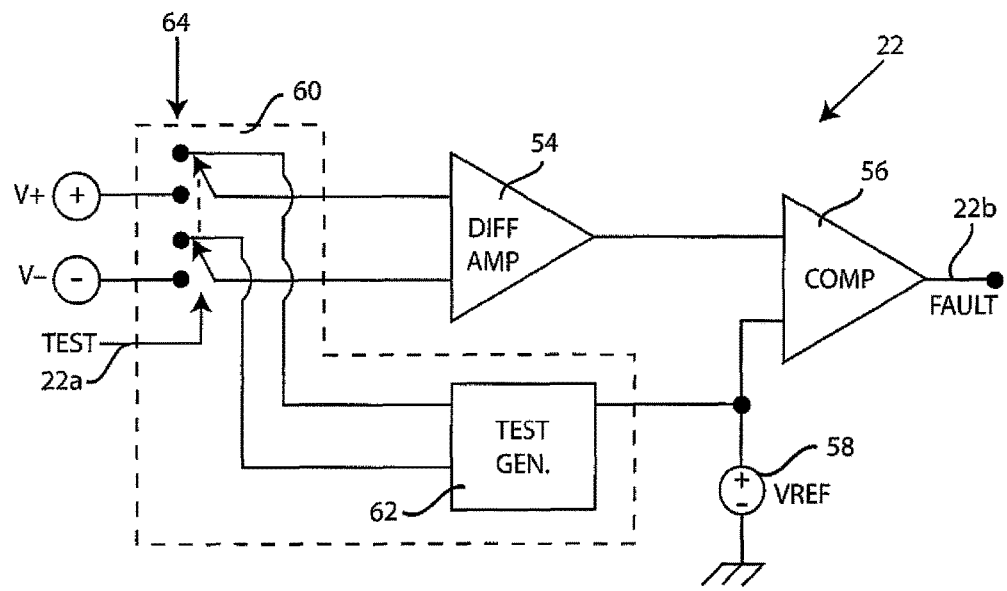
FIG. 3 is a block diagram of an example NOT EQUAL fault detector of FIG. 1.

FIG. 3 is a block diagram, set forth by way of example and not limitation, of a NOT EQUAL fault detector 22 including a differential amplifier 54, a comparator 56, and a reference voltage 58. In this example, NOT EQUAL fault detector 22 also includes DST circuitry 60 including a double-pole double-throw (DPDT) switch 64 and a test generator 62. The NOT EQUAL fault detector 22 is designed to monitor whether the differential voltage at input 16 is so large as to put the op-amp 12 into saturation. As noted previously, negative feedback is typically used to keep the differential input voltage relatively small. As used herein, "not equal" means that the differential input voltage is very small (e.g. about the offset voltage—the small differential voltage applied to the inputs to force the output to zero).

In a normal operational mode, switch 64 couples the V+ input of op-amp 12 to a first input of differential amplifier 54 and the V− input of op-amp 12 to a second input of the differential amplifier 6454. The output of differential amplifier 54 is coupled to a first input of comparator 56 and a second input of comparator 56 is coupled to voltage reference ($V_{REF}$) 58. The output of comparator 56 is, in this example, the FAULT signal on FAULT line 22b.

As described above, the NOT EQUAL fault detector 22 can be tested by activating the DST circuitry 60 by applying a Test control signal to TEST line 22a. In this example, test generator 62 has an input coupled to $V_{REF}$ 58 and two outputs with are coupled to the two inputs of differential amplifier 54 when in a test mode. Switch 64 therefore selectively couples the inputs of the differential amplifier 54 to either the inputs of the op-amp 12 or to the outputs of test generator 62.

The test generator 62 generates one or more voltage levels to determine if the NOT EQUAL fault detector 22 is working properly (e.g. if the differential voltage input to the op-amp 12 is greater than a predetermined limit). Since the control circuitry 28 generated the test control signal that is applied to the TEST line 22a, it knows that the signal on fault line 22b is in response to the test voltages produced by test generator 62 and not due to its monitoring of op-amp 12. Also, additional communication lines can be provided between the NOT EQUAL fault detector 22 and the control circuitry 28 for more communication or control.

If the control circuitry 28 determines that the NOT EQUAL fault detector 22 is not working properly, it can leave it disconnected from the op-amp 12 and/or can provide a signal on bus 40 to alert the system that the NOT EQUAL fault detector is not working properly. After the self-test, the test control signal can be removed from the TEST line 22a and the NOT EQUAL fault detector can return to its normal on-line monitoring of the operation of op-amp 12.

Figure 4:
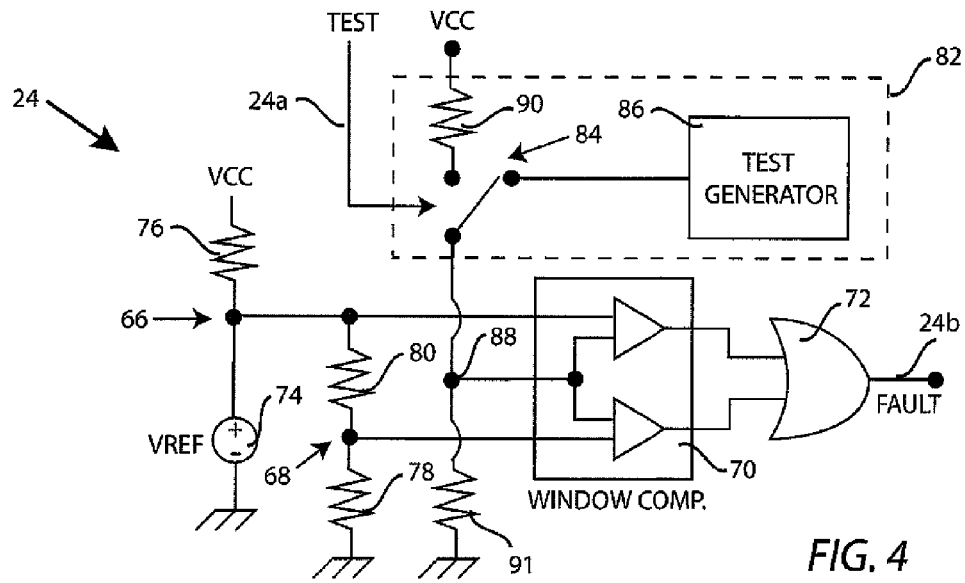
FIG. 4 is a block diagram of an example POWER SUPPLY fault detector of FIG. 1.

FIG. 4 is a block diagram, set forth by way of example and not limitation, of a POWER SUPPLY fault detector 24 including an offset voltage source 66, a voltage divider 68, a window comparator 70, and an OR gate 72. In this example, offset voltage source 66 includes a voltage reference 74 and a resistor 76 and voltage divider 68 includes a pair of resistors 80 and 78 providing a number of nodes at different voltage levels. In this example, POWER SUPPLY fault detector 24 also includes DST circuitry 82 including a single-pole double-throw (SPDT) switch 84 and a test generator 86.

In a normal operational mode, switch 84 connects Vcc to a node 88 connected to window comparator 70 by a resistor 90. A resistor 91 connects node 88 to ground. A first input to window comparator 70 is coupled to first and second nodes of voltage divider 68. A pair of outputs from window comparator 70 are coupled to inputs of OR gate 72, and a FAULT signal is developed on FAULT line 24b.

In this example, POWER SUPPLY fault detector 24 can be tested by activating the DST circuitry 82 by applying a Test control signal to TEST line 24a. Test generator 86 has an output coupled to one of the throws of SPDT switch 84 such that it can be coupled to node 88. Switch 84 therefore selectively couples node 88 to either Vcc via resistor 90 or to test generator 86.

The test generator 86 generates one or more voltage levels to determine if the POWER SUPPLY fault detector 24 is working properly (e.g. if Vcc is too low or too high). Since the control circuitry 28 generated the test control signal that is applied to the TEST line 24a, it knows that the signal on fault line 24b is in response to the test voltages produced by test generator 86 and not due to its monitoring of op-amp 12. Also, additional communication lines can be provided between the POWER SUPPLY fault detector 24 and the control circuitry 28 for more communication or control.

If the control circuitry 28 determines that the POWER SUPPLY fault detector 24 is not working properly, it can leave it disconnected from the op-amp 12 and/or can provide a signal on bus 40 to alert the system that the POWER SUPPLY fault detector is not working properly. After the self-test, the test control signal can be removed from the TEST line 24a and the POWER SUPPLY fault detector can return to its normal on-line monitoring of the operation of op-amp 12.

Figure 5:
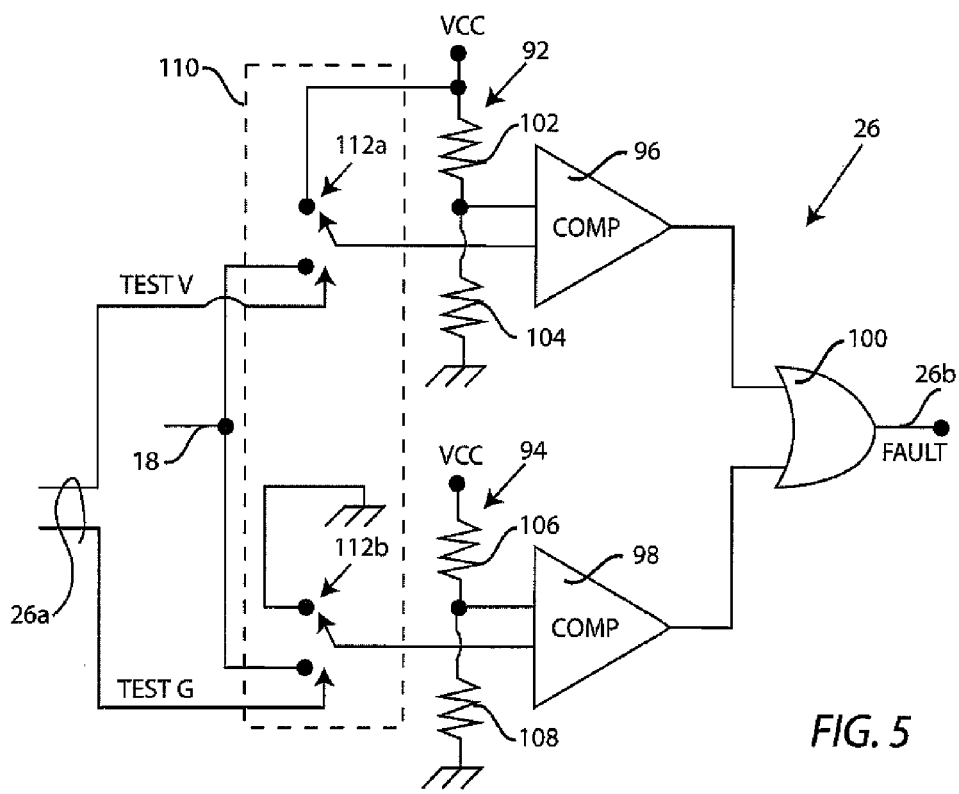
FIG. 5 is a block diagram of an example OUTUT SHORT fault detector of FIG. 1.

FIG. 5 is a block diagram, set forth by way of example and not limitation, of an OUTPUT SHORT fault detector 26 including a pair of voltage dividers 92 and 94, a pair of comparators 96 and 98, and an OR gate 100. Voltage divider 92 is coupled between Vcc and ground and includes resistors 102 and 104. Voltage divider 94 is also coupled between Vcc and ground and includes resistors 106 and 108. A first input to comparator 96 is coupled to a node between resistors 102 and 104 and a first input to comparator 98 is coupled to a node between resistors 106 and 108. In this example, OUTPUT SHORT fault detector 26 further includes DST circuitry 110 including two single-pole double-throw (SPDT) switches 112a and 112b.

In a normal operational mode, switch 112 connects output 18 of op-amp 12 to a second input to comparator 96 and to a second input to comparator 98. Outputs of comparators 96 and 98 are connected to inputs of OR gate 100 which develops a FAULT signal on FAULT line 26b.

In this example, OUTPUT SHORT fault detector 26 can be tested by activating DST circuitry 110 by applying a Test control signal to TEST line 26a which, in this case, is a bus having a TEST VOLTAGE (TEST V) line and a TEST GROUND (TEST G) line. When a TEST V signal is applied to the TEST V line of TEST line 26a, SPDT switch 112a connects the second input of comparator 96 to Vcc. When a TEST G signal is applied to the TEST G line of TEST line 26a, SPDT switch 112b connects the second input of comparator 98 to ground.

Unlike the previously discussed fault detectors, this example OUTPUT SHORT fault detector 26 does not use a test generator to produce one or more voltages. This is because the OUTPUT SHORT fault detector is used to detect whether the output of op-amp 12 is either close to Vcc or close ground (each signifying an "output short"). Therefore, comparing Vcc and ground to voltages near to Vcc and ground (from the voltage dividers 92 and 94) with comparators 96 and 98, respectively, provides a test of the proper operation of OUTPUT SHORT fault detector 28.

Since the control circuitry 28 generated the test control signal that is applied to the TEST line 26a, it knows that the signal on fault line 26b is in response to output short test and not due to its monitoring of op-amp 12. Also, additional communication lines can be provided between the OUTPUT SHORT fault detector 26 and the control circuitry 28 for more communication or control.

If the control circuitry 28 determines that the OUTPUT SHORT fault detector 26 is not working properly, it can leave it disconnected from the op-amp 12 and/or can provide a signal on bus 40 to alert the system that the OUTPUT SHORT fault detector is not working properly. After the self-test, the test control signal can be removed from the TEST line 26a and the OUTPUT SHORT fault detector can return to its normal on-line monitoring of the operation of op-amp 12.

FIGS. 6A to 6D illustrate embodiments, set forth by way of example and not limitation, for control circuitry 28 of FIG. 1. In FIG. 6A, control circuitry 28a includes electrically conductive lines formed in the bus 40, allowing off-chip control and monitoring of integrated circuit 10. This configuration can be advantageous in that it simplifies on-chip circuitry and provide sophisticated off-chip control.

In FIG. 6B, control circuitry includes combinatorial logic 114 such as AND gates, OR gates and inverters. For example, combinational logic 114 can automatically control circuit breaker 30 and/or circuit breaker 32 based upon FAULT signals from the fault detectors 20, 22, 24 and 26. For example, if FAULT lines 24b and 26b are input into an AND gate, the output of the AND gate can be applied to control lines 30a and 32a to open ("trip") both of circuit breakers 30 and 32. As another example, if FAULT lines 20b and 22b are input into an AND gate having an output going to a first input of an OR gate and if FAULT line 24b is input into a second input of the OR gate, the output of the OR gate can be applied to control line 30a to trip circuit breaker 30 if the voltage is out of specification or if a fault is detected by both the COMMON MODE fault detector and the NOT EQUAL fault detector.

It should be noted that combinatorial logic 114 can operate automatically without any off-chip control. In certain example embodiments, bus 40 is not required. In other embodiments bus 40 is provided to, for example, allow configuration of the combinatorial logic (e.g. by burning fuses) or to provide off-chip access to various signals. Advantageously, combinatorial logic is fast, inexpensive, and does not require a clock.

FIGS. 6C and 6D illustrate, by way of example and not limitation, alternative logic for implementing functions of control circuitry 28. More particularly, in FIG. 6C control circuitry 28c includes a state machine 116, and in FIG. 6D control circuitry 28d includes a microcontroller (or microprocessor) 118. While both state machine 116 and microcontroller 118 require a clock and are generally more complex, they also allow more complex and sophisticated detection, analysis and control of the circuitry. A bus 40 of one or more lines can be provided for off-chip communication with either or both of control circuits 28c and 28d, or may be omitted in some embodiments.

It will be appreciated that by monitoring the parameters and proper functioning of analog devices while they are operating ("on-line") that transient conditions and temporary part failures can be detected real-time and appropriate actions can be taken. It will also be appreciated that the various detectors can be self-tested either while the integrated circuit is operating ("on-line") or during a special test mode ("off-line"). While the detectors are in the self-testing process, they are disconnected from the analog device that they are monitoring and, as such, the operation of the analog device is unchanged during the self-testing of the detectors.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

The invention claimed is:

1. A method for detecting a fault condition of an operational amplifier of an integrated circuit during operation comprising:
    operating an integrated circuit which includes an operational amplifier (op-amp) having a V+ input, a V− input and an op-amp output and an on-line fault detector electrically coupled to the V+ input and the V− input of the op-amp of the on-line fault detector;
    monitoring an operation of the op-amp with the on-line fault detector; and
    developing a fault signal at a fault detector output if the op-amp is in a fault condition as determined by the on-line fault detector;
    wherein the on-line fault detector comprises an OUTPUT SHORT fault detector coupled to the op-amp output and including a first voltage divider coupled to a first input of a first comparator and a second voltage divider coupled to a first input of a second comparator, wherein a second input of the first comparator and a second input of the second comparator are selectively coupled to the op-amp output, wherein the first comparator provides a first fault signal if the op-amp output is shorted to Vcc, and wherein the second comparator provides a second fault signal if the op-amp output is shorted to ground, whereby a fault signal is applied to the fault detector output upon the occurrence of at least one of the first fault signal and the second fault signal.

2. A method for detecting a fault condition of an operational amplifier of an integrated circuit during operation as recited in claim 1 wherein the on-line fault detector includes detector self-test (DST) circuitry.

3. A method for detecting a fault condition of an operational amplifier of an integrated circuit during operation as recited in claim 1 wherein the on-line fault detector includes a test generator.

4. A method for detecting a fault condition of an operational amplifier of an integrated circuit during operation comprising:
    operating an integrated circuit which includes an operational amplifier (op-amp) having a V+ input, a V− input and an op-amp output and an on-line fault detector electrically coupled to the V+ input and the V− input of the op-amp of the on-line fault detector;

monitoring an operation of the op-amp with the on-line fault detector; and developing a fault signal at a fault detector output if the op-amp is in a fault condition as determined by the on-line fault detector;

wherein the on-line fault detector includes detector self-test (DST) circuitry and a test generator; and wherein the on-line fault detector comprises a COMMON MODE fault detector including a first window comparator having an input selectively coupled to the V+ input to develop a first fault signal when the voltage on the V+ input is out of a first range and a second window comparator having an input selectively coupled to the V− input which produces a second fault signal when the voltage on the V− input is out of a second range, whereby a fault signal is applied to the fault detector output upon the occurrence of at least one of the first fault signal and the second fault signal.

5. A method for detecting a fault condition of an operational amplifier of an integrated circuit during operation as recited in claim 4 further comprising activating the test generator to selectively apply test signals to the first window comparator and the second window comparator.

6. A method for detecting a fault condition of an operational amplifier of an integrated circuit during operation comprising:

operating an integrated circuit which includes an operational amplifier (op-amp) having a V+ input, a V− input and an op-amp output and an on-line fault detector electrically coupled to the V+ input and the V− input of the op-amp of the on-line fault detector;

monitoring an operation of the op-amp with the on-line fault detector; and developing a fault signal at a fault detector output if the op-amp is in a fault condition as determined by the on-line fault detector;

wherein the on-line fault detector includes detector self-test (DST) circuitry and a test generator; and wherein the on-line fault detector comprises a NOT EQUAL fault detector including a differential amplifier, a comparator, and a reference voltage, wherein the differential amplifier has a first input selectively coupled to the V+ input and a second input selectively coupled to the V− input, wherein a first input of the comparator is coupled to an output of the differential amplifier and a second input of the comparator is coupled to the reference voltage, and wherein the output of the comparator comprises the fault detector output.

7. A method for detecting a fault condition of an operational amplifier of an integrated circuit during operation as recited in claim 6 further comprising activating the test generator to apply test signals to the differential amplifier.

8. A method for detecting a fault condition of an operational amplifier of an integrated circuit during operation comprising:

operating an integrated circuit which includes an operational amplifier (op-amp) having a V+ input, a V− input and an op-amp output and an on-line fault detector electrically coupled to the V+ input and the V− input of the op-amp of the on-line fault detector;

monitoring an operation of the op-amp with the on-line fault detector; and developing a fault signal at a fault detector output if the op-amp is in a fault condition as determined by the on-line fault detector;

wherein the on-line fault detector includes detector self-test (DST) circuitry and a test generator; and wherein the on-line fault detector comprises a POWER SUPPLY fault detector including a voltage divider having a number of nodes coupled to the op-amp power supply input, a window comparator having a first input coupled to a first node of the voltage divider which produces a first fault signal when a voltage of the op-amp power supply input exceeds a first threshold value and a second input coupled to a second node of the voltage divider which produces a second fault signal when a voltage of the op-amp power supply falls below a second threshold value, whereby a fault signal is applied to the fault detector output upon the occurrence of at least one of the first fault signal and the second fault signal.

9. A method for detecting a fault condition of an operational amplifier of an integrated circuit during operation as recited in claim 8 further comprising activating the test generator to apply test signals to the window comparator input.

* * * * *